(12) United States Patent
Yang

(10) Patent No.: US 8,012,675 B2
(45) Date of Patent: Sep. 6, 2011

(54) METHOD OF PATTERNING TARGET LAYER ON SUBSTRATE

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 554 days.

(21) Appl. No.: 12/212,939

(22) Filed: Sep. 18, 2008

(65) Prior Publication Data

US 2010/0068657 A1    Mar. 18, 2010

(51) Int. Cl.
*G03F 7/20* (2006.01)
(52) U.S. Cl. ........ 430/323; 430/299; 430/313; 430/328; 430/394
(58) Field of Classification Search ............... 430/299, 430/313, 323, 328, 394
See application file for complete search history.

(56) References Cited

U.S. PATENT DOCUMENTS

| | | | |
|---|---|---|---|
| 6,242,164 B1 | 6/2001 | Choi et al. | |
| 6,383,715 B1 * | 5/2002 | Lu et al. | 430/270.1 |
| 6,383,952 B1 | 5/2002 | Subramanian et al. | |
| 6,534,243 B1 | 3/2003 | Templeton et al. | |
| 6,589,713 B1 * | 7/2003 | Okoroanyanwu | 430/313 |
| 2006/0275697 A1 | 12/2006 | Hata et al. | |

FOREIGN PATENT DOCUMENTS

| | | |
|---|---|---|
| TW | 432447 | 5/2001 |
| TW | 469521 | 12/2001 |
| TW | 1254191 | 5/2006 |

OTHER PUBLICATIONS

English abstract of KR 2007070873 A, 2007.*

* cited by examiner

*Primary Examiner* — Shean Wu
(74) *Attorney, Agent, or Firm* — J.C. Patents

(57) ABSTRACT

A method of patterning a target layer on a substrate is described. A patterned photoresist layer is formed over the target layer, wherein the patterned photoresist layer has unexposed parts as separate islands and each unexposed part has a low proton concentration at least in its sidewalls. Acid-crosslinked polymer layers are formed only on the sidewalls of each unexposed part. A flood exposure step is performed to the substrate. A baking step is performed to the patterned photoresist layer. A development step is performed to remove the previously unexposed parts. The target layer is etched with the acid-crosslinked polymer layers as a mask.

19 Claims, 5 Drawing Sheets

METHOD OF PATTERNING TARGET LAYER ON SUBSTRATE

BACKGROUND OF THE INVENTION

1. Field of the Invention

This invention relates to integrated circuit (IC) fabrication, and more particularly relates to a method of patterning a target layer on a substrate, which can make a reduced device pitch.

2. Description of the Related Art

As the requirement on the integration degree of IC devices becomes higher, the device pitch has to be reduced. The device pitch can be reduced by enhancing the lithographic resolution, or in an easier way by forming spacers at two sides of each photoresist pattern and removing the photoresist patterns so that the remaining spacers have a reduced pitch and serve as an etching mask for the target layer to be patterned.

FIGS. 1A-1F illustrate a method of patterning a target layer in a reduced pitch in the prior art.

Referring to FIG. 1A, a target layer 104 to be patterned and a photoacid chemical amplification photoresist layer 106 are formed on a substrate 102. An exposure step is done to form unexposed parts 106a and exposed parts 106b in the photoresist layer 106, wherein each exposed part 106b has a low proton (photoacid) concentration and each unexposed part 106a has a very low proton concentration in a top portion and sidewalls thereof. Post-exposure baking (PEB) is performed causing chemical amplification of the photoacid, so that the exposed parts 106b have a high proton concentration and each unexposed part 106a has a low proton concentration in its top portion and sidewalls.

Referring to FIG. 1B, a development step is performed to remove the exposed parts 106b, such that only the unexposed parts 106a remain on the target layer 104.

Referring to FIG. 1C, an acid-crosslinked polymer layer 112 is formed on the top portion and the sidewalls of each unexposed part 106a. The acid-crosslinked polymer layer 112 is usually formed by coating a layer of acid-crosslinkable polymeric material, baking the same to cause crosslinkage around each unexposed part 106a by the protons at its top portion and sidewalls and removing the non-crosslinked polymeric material. This step called a RELACS process, as described in U.S. Pat. No. 6,383,952.

Referring to FIG. 1D, the top portion of the acid-crosslinked polymer layer 112 over each unexposed part 106a is removed by etching-back or chemical mechanical polishing (CMP) to form polymer spacers 112a, wherein the surface layer 106c of each unexposed part 106a is chemically altered due to the etching-back or CMP effect.

Referring to FIG. 1E, a flood exposure step 114 and another PEB step 116 are performed in turn so that the previously unexposed parts 106a all have a high proton concentration and can be dissolved in a development liquid.

Referring to FIG. 1F, another development step is done to remove the previously unexposed parts 106a and form patterns (112a) with a reduced pitch. However, for the surface layers 106c of the unexposed parts 106a have been chemically altered, they are not all removed completely in the development, as shown in FIG. 1F. Hence, the target layer 104 is patterned with the polymer spacers 112a and the residual unexposed parts 106a and 106c as a mask to have different pitches, as indicated by the dash lines.

SUMMARY OF THE INVENTION

Accordingly, the invention provides a method of patterning a target layer on a substrate that can make a reduced pitch, wherein the photoresist material is all removed making a uniform reduced pitch.

The method of patterning a target layer on a substrate is described as follows. A patterned photoresist layer is formed over the target layer, wherein the patterned photoresist layer has unexposed parts as separate islands and each unexposed part has a low proton concentration at least in its sidewalls. Acid-crosslinked polymer layers are formed only on the sidewalls of each unexposed part. A flood exposure step is performed to the substrate. A baking step is performed to the patterned photoresist layer. A development step is performed to remove the previously unexposed parts. The target layer is then etched with the acid-crosslinked polymer layers as a mask.

In an embodiment, the patterned photoresist layer includes a photoresist material of photoacid chemical amplification type.

In some embodiments, each unexposed part has substantially no proton in its top portion so that the acid-crosslinked polymer layers are formed only on its sidewalls. The top portion may have been subjected to a surface treatment for proton removal previously so that each unexposed part has substantially no proton in its top portion. The surface treatment may include an acid-base neutralization treatment.

In some embodiments, each unexposed part is covered by a photosensitive blocking layer that produces no photoacid in exposure so that the acid-crosslinked polymer layers are formed only on its sidewalls, and the blocking layer includes a material that can be removed in development after being exposed. The photosensitive blocking layer may include a photosensitive top anti-reflection coating (TARC).

Since the acid-crosslinked polymer layers are formed only on the sidewalls of each unexposed part in this invention, no process for removing a polymer layer above the unexposed part is needed. Hence, the surface layers of the unexposed parts are not chemically altered, so the unexposed parts are removed completely in the development after being exposed and baked. Consequently, the target layer patterned with the acid-crosslinked polymer layers as a mask has a uniform reduce pitch.

It is to be understood that both the foregoing general description and the following detailed description are exemplary, and are intended to provide further explanation of the invention as claimed.

DESCRIPTION OF THE PREFERRED EMBODIMENTS

First Embodiment

FIGS. 2A-2H illustrate a method of patterning a target layer on a substrate according to the first embodiment of this invention.

Figure 1A:
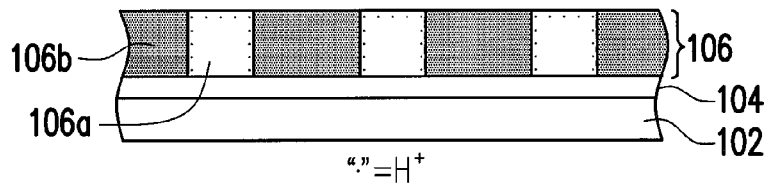
FIGS. 1A-1F illustrate a method of patterning a target layer in a reduced pitch in the prior art.
Figure 1B:
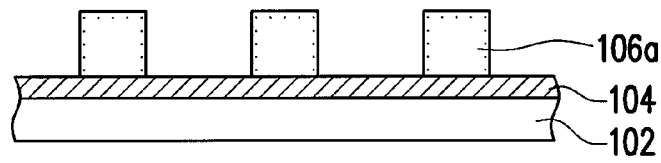
Figure 1C:
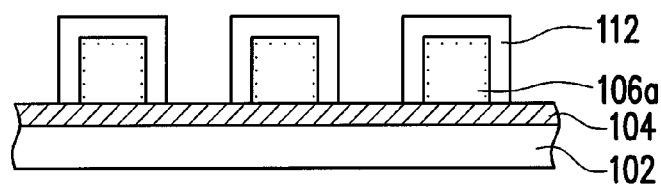
Figure 1D:
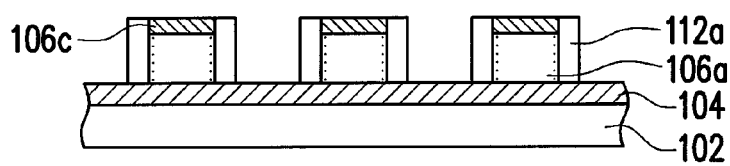
Figure 1E:
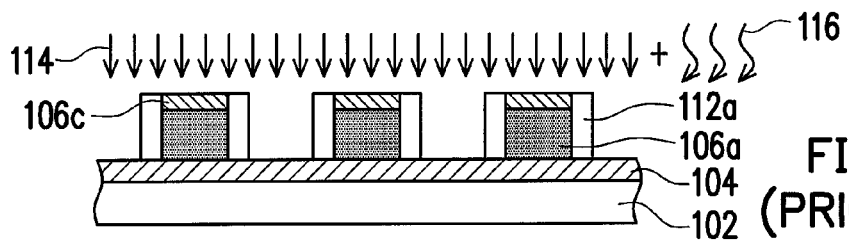
Figure 1F:
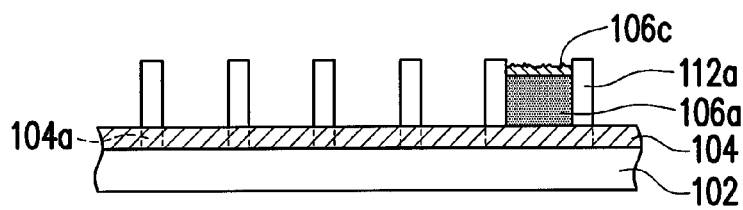
Figure 2A:
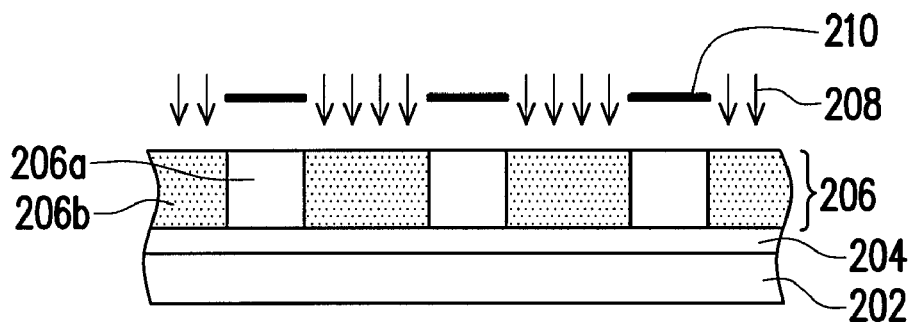
FIGS. 2A-2H illustrate a method of patterning a target layer on a substrate according to a first embodiment of this invention.

Referring to FIG. 2A, a target layer 204 to be patterned is formed over a substrate 202, a photoacid chemical amplification photoresist layer 206 is formed on the target layer 204. An exposure step 208 is performed using a photomask 210 to form exposed parts 206b and unexposed parts 206a in the photoresist layer 206, wherein the exposed parts 206b have a low proton concentration and each unexposed part 206a has a very low proton concentration in its top portion and sidewalls due to light diffraction.

Figure 2B:
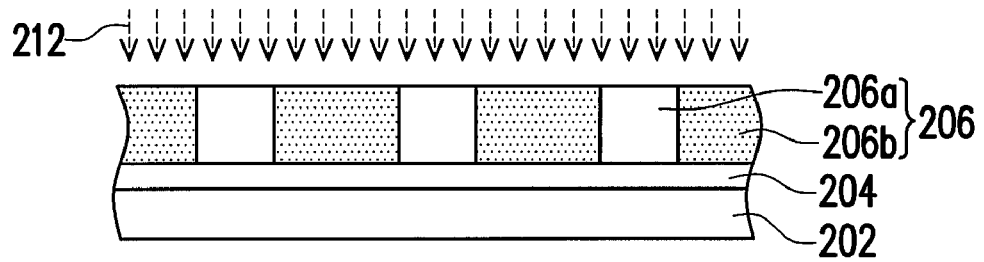

Referring to FIG. 2B, a surface treatment 212 is performed to the photoresist layer 206 to remove the protons in the top portion of each unexposed part 206a. The surface treatment 212 may include an acid-base neutralization treatment, which may include introducing a basic gas or liquid. The basic gas or liquid may include $NH_3$.

Figure 2C:
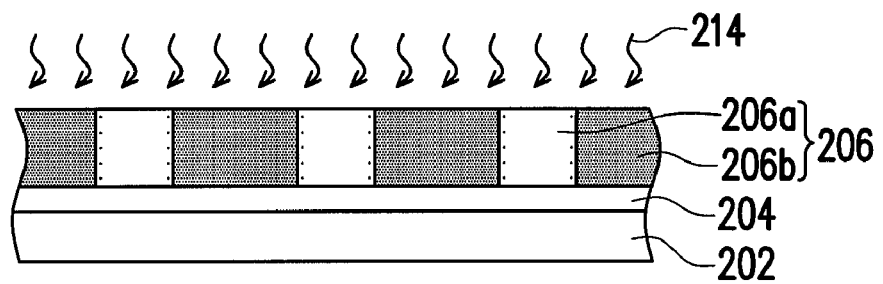

Referring to FIG. 2C, post-exposure baking (PEB) 214 is performed to the photoresist layer 206 causing chemical amplification, so that the exposed parts 206b have a high proton concentration and can be dissolved in a development liquid, and each unexposed part 206a previously having a very low proton concentration at its sidewalls has a low proton concentration at its sidewalls. It is noted that the top portion of each unexposed part 206a still contains substantially no proton even after the PEB 214, because the protons in the top portion of each unexposed part 206a have been removed previously.

Figure 2D:
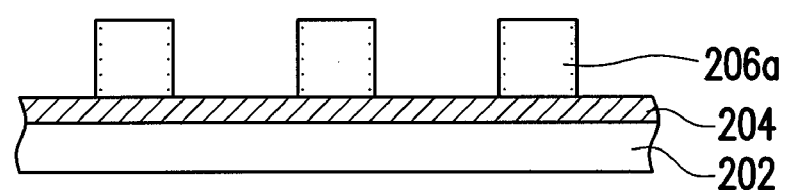

Referring to FIG. 2D, a first development step is performed to remove the exposed parts 206b having a high proton concentration, so that only the unexposed parts 206a remain on the target layer 204.

Figure 2E:
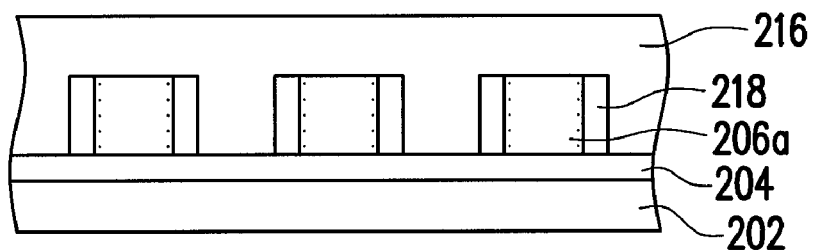

Referring to FIG. 2E, an acid-crosslinkable polymeric layer 216, which may include the RELACS polymer disclosed in U.S. Pat. No. 6,383,952, is formed covering the unexposed parts 206a. The substrate 202 is then baked to crosslink a portion of the acid-crosslinkable polymeric layer 216 on the sidewalls of each unexposed part 206a by the protons in a low concentration in the sidewalls of each unexposed part 206a, so that acid-crosslinked polymer layers 218 are formed only on the sidewalls of the unexposed parts 206a.

Figure 2F:
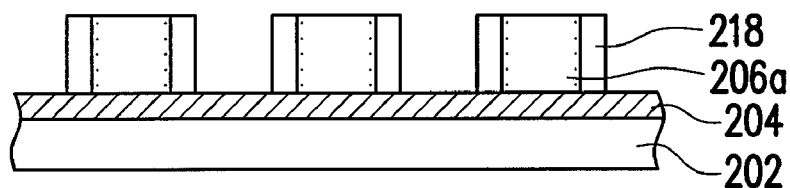

Referring to FIG. 2F, the non-crosslinked portion of the acid-crosslinkable polymeric layer 216 is then removed.

Figure 2G:
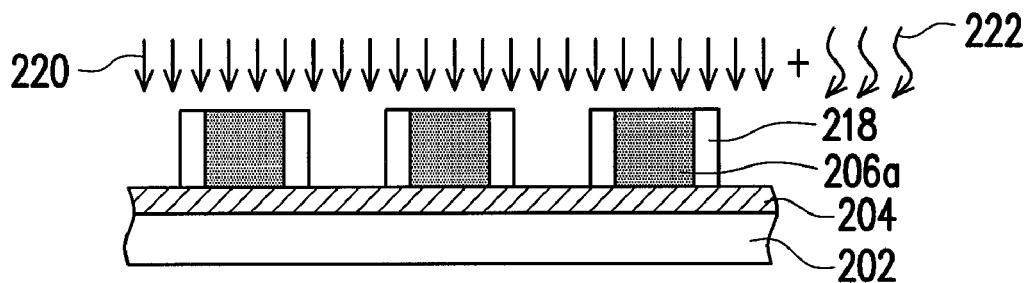

Referring to FIG. 2G, a flood exposure step 220 and another PEB step 222 are performed in sequence so that the previously unexposed parts 206a have a high proton concentration and can be dissolved in a development liquid.

Figure 2H:
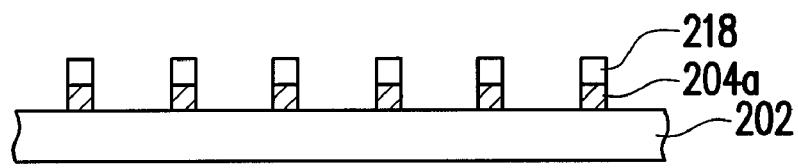

Referring to FIG. 2H, a second development step is performed to remove the previously unexposed parts 206a. The target layer 204 is then etch-patterned using the acid-crosslinked polymer layers 218 as a mask to form a patterned target layer 204a with a reduced pitch that is a half of the pitch of the unexposed parts 206a in FIG. 2D.

Second Embodiment

FIGS. 3A-3H illustrate a method of patterning a target layer on a substrate according to the second embodiment of this invention.

Figure 3A:
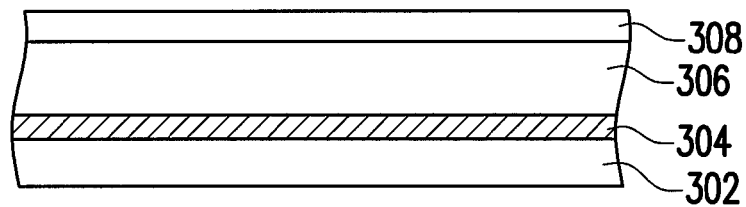
FIGS. 3A-3H illustrate a method of patterning a target layer on a substrate according to a second embodiment of this invention.

Referring to FIG. 3A, a target layer 304 to be patterned is formed on a substrate 302, and then a photoacid chemical amplification photoresist layer 306 and a photo-sensitive blocking layer 308 are formed on the target layer 304 in sequence. The photo-sensitive blocking layer 308 includes a material that can be dissolved in a development liquid after being exposed. Such a photosensitive blocking layer 308 may be a photo-sensitive top anti-reflection coating (TARC).

Figure 3B:
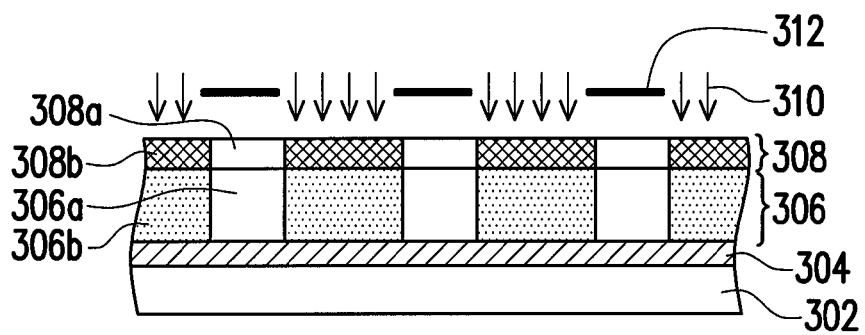

Referring to FIG. 3B, an exposure step 310 is performed using a photomask 312 to form exposed parts 306b and unexposed parts 306a in the photoresist layer 306 and form exposed parts 308b and unexposed parts 308a in the blocking layer 308, wherein the exposed parts 306b have a low proton concentration and each unexposed part 306a has a very low proton concentration in its top portion and sidewalls.

Figure 3C:
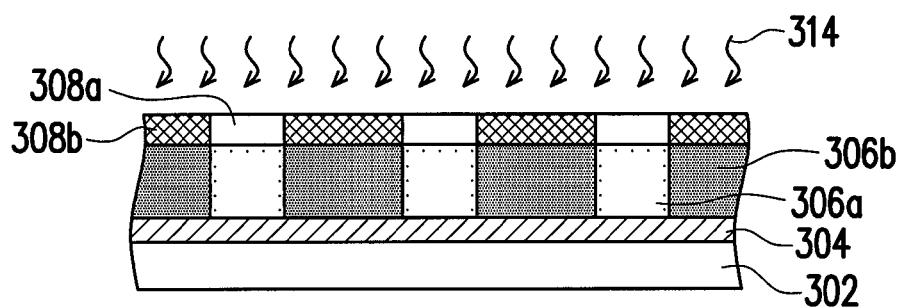

Referring to FIG. 3C, post-exposure baking (PEB) 314 is performed causing chemical amplification, so that the exposed parts 306b have a high proton concentration and can be dissolved in a development liquid, and each unexposed part 306a previously having a very low proton concentration in its top portion and sidewalls has a low proton concentration at its top portion and sidewalls.

Figure 3D:
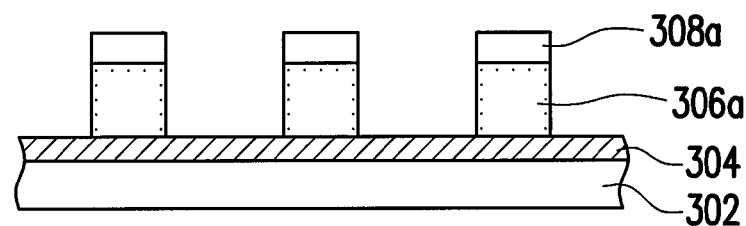

Referring to FIG. 3D, a first development step is done to remove the exposed parts 306b of the photoresist layer 306 and the exposed parts 308b of the blocking layer 308, so that only the unexposed parts 308a of the blocking layer 308 and the unexposed parts 306a of the photoresist layer 306 remain on the target layer 304.

Figure 3E:
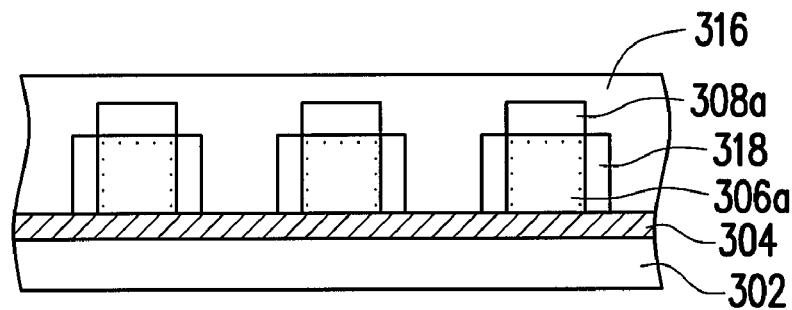

Referring to FIG. 3E, an acid-crosslinkable polymeric layer 316, which may include the RELACS polymer disclosed in U.S. Pat. No. 6,383,952, is formed covering the unexposed parts 306a and 308a. The substrate 302 is baked to crosslink a portion of the acid-crosslinkable polymeric layer 316 on the sidewalls of each unexposed part 306a by the protons in the sidewalls of each unexposed part 306a, so that acid-crosslinked polymer layers 318 are formed on the sidewalls of the unexposed parts 306a. It is particularly noted that no acid-crosslinked polymer layer is formed above the unexposed parts 306a, for the top of each unexposed part 306a is blocked by an unexposed part 308a of the blocking layer 308 that produces no photoacid in the exposure.

Figure 3F:
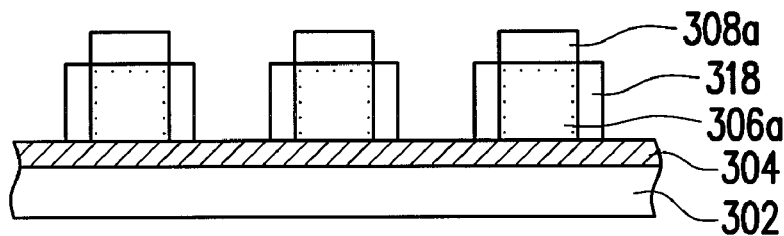

Referring to FIG. 3F, the non-crosslinked portion of the acid-crosslinkable polymeric layer 316 is then removed.

Figure 3G:
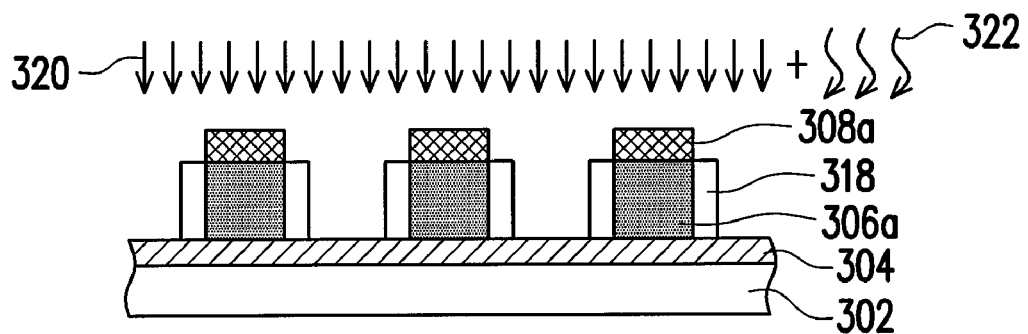

Referring to FIG. 3G, a flood exposure step 320 and another PEB step 322 are performed in sequence, so that the previously unexposed parts 308a of the blocking layer 308 become dissolvable in a development liquid and the previously unexposed parts 306a of the photoresist layer 306 have a high proton concentration and become dissolvable in a development liquid.

Figure 3H:
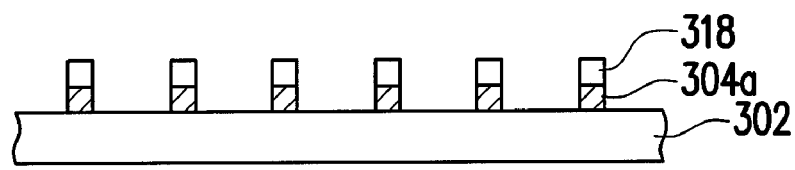

Referring to FIG. 3H, a second development step is performed to remove the previously unexposed parts 308a and 306a. The target layer 304 is etch-patterned with the acid-crosslinked polymer layers 318 as a mask to form a patterned target layer 304a having a reduced pitch that is a half of the pitch of the unexposed parts 306a in FIG. 3D.

Since the acid-crosslinked polymer layers are formed only on the sidewalls of each unexposed part of the photoresist layer in the above embodiments, no process for removing a polymer layer above each unexposed part is needed. Hence, the surface layers of the unexposed parts are not chemically altered, so that the unexposed parts are removed completely later and patterns with a uniform reduce pitch are obtained.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of patterning a target layer on a substrate, comprising:
    forming a patterned photoresist layer over the target layer, wherein the patterned photoresist layer has a plurality of unexposed parts as separate islands, and each of the unexposed parts has a low proton concentration at least in sidewalls thereof;
    forming acid-crosslinked polymer layers only on the sidewalls of each unexposed part;
    performing a flood exposure step to the substrate;
    performing a baking step to the patterned photoresist layer;

performing a development step to remove the previously unexposed parts; and etching the target layer with the acid-crosslinked polymer layers as a mask.

2. The method of claim 1, wherein the patterned photoresist layer comprises a photoresist material of photoacid chemical amplification type.

3. The method of claim 1, wherein each of the unexposed parts has substantially no proton in a top portion thereof so that the acid-crosslinked polymer layers are formed only on the sidewalls thereof.

4. The method of claim 3, wherein the top portion has been subjected to a surface treatment for proton removal previously so that each unexposed part substantially has no proton in the top portion thereof.

5. The method of claim 4, wherein the surface treatment comprises an acid-base neutralization treatment.

6. The method of claim 5, wherein the acid-base neutralization treatment comprises introducing a basic gas or liquid.

7. The method of claim 6, wherein the basic gas or liquid contains $NH_3$.

8. The method of claim 1, wherein each of the unexposed parts is covered by a photosensitive blocking layer that produces no photoacid in exposure so that the acid-crosslinked polymer layers are formed only on the sidewalls thereof, and the photo-sensitive blocking layer comprises a material that can be removed in development after being exposed.

9. The method of claim 8, wherein the photosensitive blocking layer comprises a photosensitive top anti-reflection coating (TARC).

10. A method of patterning a target layer on a substrate, comprising:

forming a photoresist layer over the target layer;

performing an exposure step to form a plurality of exposed parts and a plurality of unexposed parts in the photoresist layer;

performing a surface treatment to the photoresist layer to remove protons in top portions of the unexposed parts;

performing post-exposure baking (PEB) to the photoresist layer;

performing a first development step to remove the exposed parts;

forming acid-crosslinked polymer layers only on sidewalls of each unexposed part;

performing a flood exposure step to the substrate;

performing a baking step to the photoresist layer;

performing a second development step to remove the previously unexposed parts; and etching the target layer with the acid-crosslinked polymer layers as a mask.

11. The method of claim 10, wherein the photoresist layer comprises a photoresist material of photoacid chemical amplification type.

12. The method of claim 10, wherein the surface treatment comprises an acid-base neutralization treatment.

13. The method of claim 12, wherein the acid-base neutralization treatment comprises introducing a basic gas or liquid.

14. The method of claim 13, wherein the basic gas or liquid contains $NH_3$.

15. The method of claim 10, wherein forming the acid-crosslinked polymer layers comprises:

forming an acid-crosslinkable polymeric layer covering the unexposed parts;

baking the substrate to crosslink portions of the acid-crosslinkable polymeric layer on the sidewalls of each unexposed part; and removing a non-crosslinked portion of the acid-crosslinkable polymeric layer.

16. A method of patterning a target layer on a substrate, comprising:

sequentially forming a photoresist layer and a photosensitive blocking layer over the target layer, wherein the blocking layer produces no photoacid in exposure;

performing an exposure step to form a plurality of first exposed parts and first unexposed parts in the blocking layer and form a plurality of second exposed parts and second unexposed parts in the photoresist layer;

performing post-exposure baking (PEB) to the photoresist layer;

performing a first development step to remove the first and second exposed parts;

forming acid-crosslinked polymer layers only on sidewalls of each of the second unexposed parts;

performing a flood exposure step to the substrate;

performing a baking step to the photoresist layer;

performing a second development step to remove the first and second unexposed parts after they are exposed in the flood exposure step and baked; and etching the target layer with the acid-crosslinked polymer layers as a mask.

17. The method of claim 16, wherein the photoresist layer comprises a photoresist material of photoacid chemical amplification type.

18. The method of claim 16, wherein the photosensitive blocking layer comprises a photosensitive top anti-reflection coating (TARC).

19. The method of claim 16, wherein forming the acid-crosslinked polymer layers comprises:

forming an acid-crosslinkable polymeric layer covering the first unexposed parts and the second unexposed parts;

baking the substrate to crosslink portions of the acid-crosslinkable polymeric layer on the sidewalls of each second unexposed part; and removing a non-crosslinked portion of the acid-crosslinkable polymeric layer.

* * * * *